US007795884B2

(12) United States Patent
Cox

(10) Patent No.: US 7,795,884 B2
(45) Date of Patent: Sep. 14, 2010

(54) METHOD AND APPARATUS FOR CALCULATING THE NUMBER OF TURNS PER SEGMENT OF A TRANSFORMER COIL WINDING

(75) Inventor: David N. Cox, Raleigh, NC (US)

(73) Assignee: ABB Research Ltd., Zurich (CH)

( * ) Notice: Subject to any disclaimer, the term of this patent is extended or adjusted under 35 U.S.C. 154(b) by 1065 days.

(21) Appl. No.: 11/504,411

(22) Filed: Aug. 15, 2006

(65) Prior Publication Data

US 2008/0042793 A1 Feb. 21, 2008

(51) Int. Cl.
*G01R 29/20* (2006.01)
*H01F 5/00* (2006.01)

(52) U.S. Cl. ........................ 324/726; 336/200; 323/262; 700/97

(58) Field of Classification Search ................. 324/726; 323/262

See application file for complete search history.

(56) References Cited

U.S. PATENT DOCUMENTS 3,953,791 A * 4/1976 Spurr et al. ................. 324/200
4,990,860 A * 2/1991 Peterson ..................... 324/726
5,572,435 A * 11/1996 Kaltenecker ................... 716/1
5,946,210 A * 8/1999 Montminy et al. ............ 700/97
7,373,714 B2 * 5/2008 Akselrod et al. ........... 29/602.1

* cited by examiner

*Primary Examiner*—Timothy J Dole
*Assistant Examiner*—John Zhu
(74) *Attorney, Agent, or Firm*—GDS Legal Dept.

(57) ABSTRACT

A method and an apparatus for calculating the number of turns per segment of a transformer coil winding which has a plurality of segments connected in series. The number of turns per segments is computed by assigning to segments predefined parameters related to customer requirements. Then a system of linear equations is automatically generated and the equations are simultaneously solved.

16 Claims, 2 Drawing Sheets

METHOD AND APPARATUS FOR CALCULATING THE NUMBER OF TURNS PER SEGMENT OF A TRANSFORMER COIL WINDING

FIELD OF THE INVENTION

The present invention relates to a method and an apparatus for calculating the number of turns per segment of a transformer coil winding.

BACKGROUND OF THE INVENTION

As it is known, electrical transformers are industrial devices used to convert electrical energy from one voltage potential to another. The voltage transformer has two main components, the core and the coil. The core is made from materials such as steel or iron and may have a single leg or multiple legs depending on the type of transformer. The coil of a transformer consists of conductive material, typically wire, wound around the leg(s) of the core so as to form the coil windings.

Transformers are manufactured according to various customer specifications and one of the most difficult tasks in designing the transformer is designing the coil. In its simplest form, the coil of a transformer has a single primary winding and a single secondary winding. In a complex coil design, there may be multiple windings.

Each winding of a transformer coil consists of some number of segments which in practice are electrical circuits connected in series. Different numbers of segments are connected in series to achieve different voltages. In many cases a minimum of two segments are connected in series to achieve the minimum voltage and all the segments are connected in series to achieve the maximum voltage.

One of the problems in designing a transformer is determining the number of turns of conducting wire for each winding segment, i.e. the so-called turns-per-segment. Transformer designers use some mathematical methods to perform such calculations which are based on some simplifying assumptions. For example, it is often assumed that the segments are of uniform construction. These assumptions simplify the calculations but are prone to introduce errors. Further at the present state of the art, different equations are used to calculate the turns of the various segments depending on the design of the transformer. These equations are hard coded into software and new equations should be developed and new code added to the software when faced with a new transformer design. This clearly requires recompiling and linking the code and then distributing the code to all the users, which is a time consuming and expensive process.

Thus it is desirable to provide a solution which improves the calculation of the number of turns of transformer winding segments and increases the overall quality of transformer design.

SUMMARY OF THE INVENTION

In accordance with the present invention, a method for calculating the number of turns ($t_1, t_2, \ldots, t_n$) per segment of a transformer coil winding which comprises n segments ($S_1, S_2, \ldots, S_n$,) connected in series is provided. The method comprises:

- assigning to each of said n segments ($S_1, S_2, \ldots, S_n$) a predetermined value ($R_i$) representing the respective volts-per-turn value;
- assigning to each combination of segments ($S_1$-$S_n$, $S_1$-$S_{n-1}$-$S_n$, $S_1$-$S_2$-$S_{n-1}$-$S_n$, . . . ) obtained by the connection in series of one or more of said n segments with one reference segment ($S_n$) selected from said n segments a respective predetermined value ($V_1, V_2, \ldots, V_n$) representing the voltage across each of said combinations;
- assigning a predetermined number of turns ($t_n$) to at least said reference segment ($S_n$);
- generating simultaneously a system of (n−1) linear equations in (n−1) unknowns wherein said (n−1) unknowns represent the number of turns for all segments other than said reference segment ($S_n$);
- solving said system of (n−1) linear equations simultaneously to thereby determine the number of turns of all segments other than said reference segment ($S_n$).

The present invention encompasses also a system for calculating the number of turns ($t_1, t_2, \ldots, t_n$) per segment of a transformer coil winding which comprises n segments ($S_1, S_2, \ldots, S_n$,) connected in series, the system comprising a computing device having therein program code configured to:

- assign to each of said n segments ($S_1, S_2, \ldots, S_n$) a predetermined value ($R_i$) representing the respective volts-per-turn value;
- assign to each combination of segments ($S_1$-$S_n$, $S_1$-$S_{n-1}$-$S_n$, $S_1$-$S_2$-$S_{n-1}$-$S_n$, . . . ) obtained by the connection in series of one or more of said n segments with one reference segment ($S_n$) selected from said n segments themselves a respective predetermined value ($V_1, V_2, \ldots, V_n$) representing the voltage across each of said combinations;
- assign a predetermined number of turns ($t_n$) to at least said reference segment ($S_n$);
- generate simultaneously a system of (n−1) linear equations in (n−1) unknowns wherein said unknowns represent the number of turns for all segments other than said reference segment ($S_n$);
- solve said system of (n−1) linear equations simultaneously to thereby determine the number of turns of all segments other than said reference segment ($S_n$).

A computer program product for calculating the number of turns ($t_1, t_2, \ldots, t_n$) per segment of a transformer coil winding which comprises n segments ($S_1, S_2, \ldots, S_n$,) connected in series, comprising a computer-readable medium having thereon computer usable program code configured to:

- assign to each of said n segments ($S_1, S_2, \ldots, S_n$) a predetermined value ($R_i$) representing the respective volts-per-turn value;
- assign to each combination of segments ($S_1$-$S_n$, $S_1$-$S_{n-1}$-$S_n$, $S_1$-$S_2$-$S_{n-1}$-$S_n$, . . . ) obtained by the connection in series of one or more of said n segments with one reference segment ($S_n$) selected from said n segments themselves a respective predetermined value ($V_1, V_2, \ldots, V_n$) representing the voltage across each of said combinations;
- assign a predetermined number of turns ($t_n$) to at least said reference segment ($S_n$);
- generate simultaneously a system of (n−1) linear equations in (n−1) unknowns wherein said unknowns represent the number of turns for all segments other than said reference segment ($S_n$);

solve said system of (n−1) linear equations simultaneously to thereby determine the number of turns of all segments other than said reference segment ($S_n$).

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

It should be noted that in order to clearly and concisely disclose the present invention, the drawings may not necessarily be to scale and certain features of the invention may be shown in somewhat schematic form.

Figure 1:
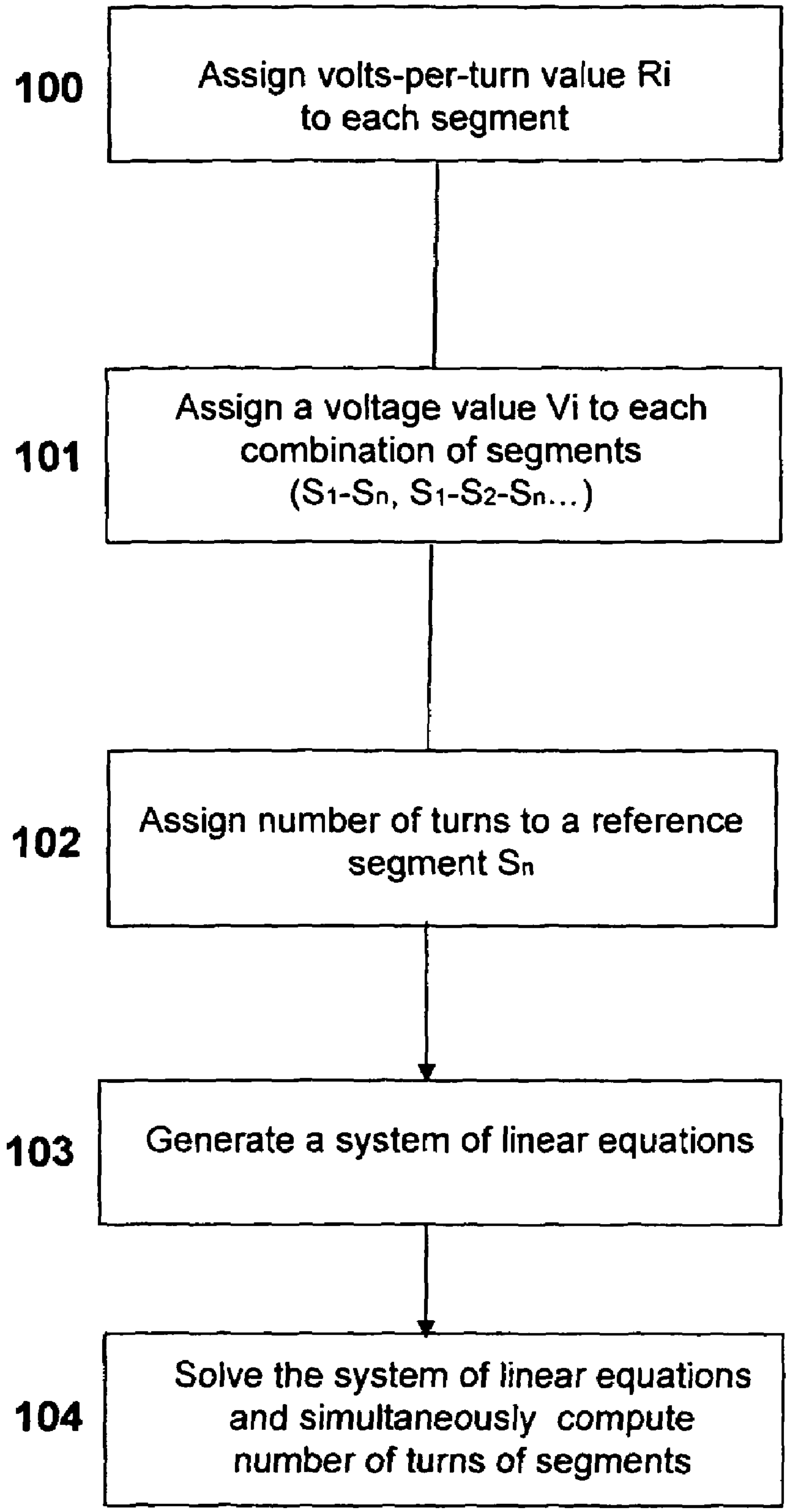
FIG. 1 is an exemplary flow diagram schematically representing an embodiment of the method for calculating the number of turns per segment of a transformer coil winding according to the present invention.

A method according to the present invention, a representative diagram block of which is shown in FIG. 1, can be advantageously used for calculating the number of turns of transformer windings of virtually any type of electrical transformer.

Figure 2:
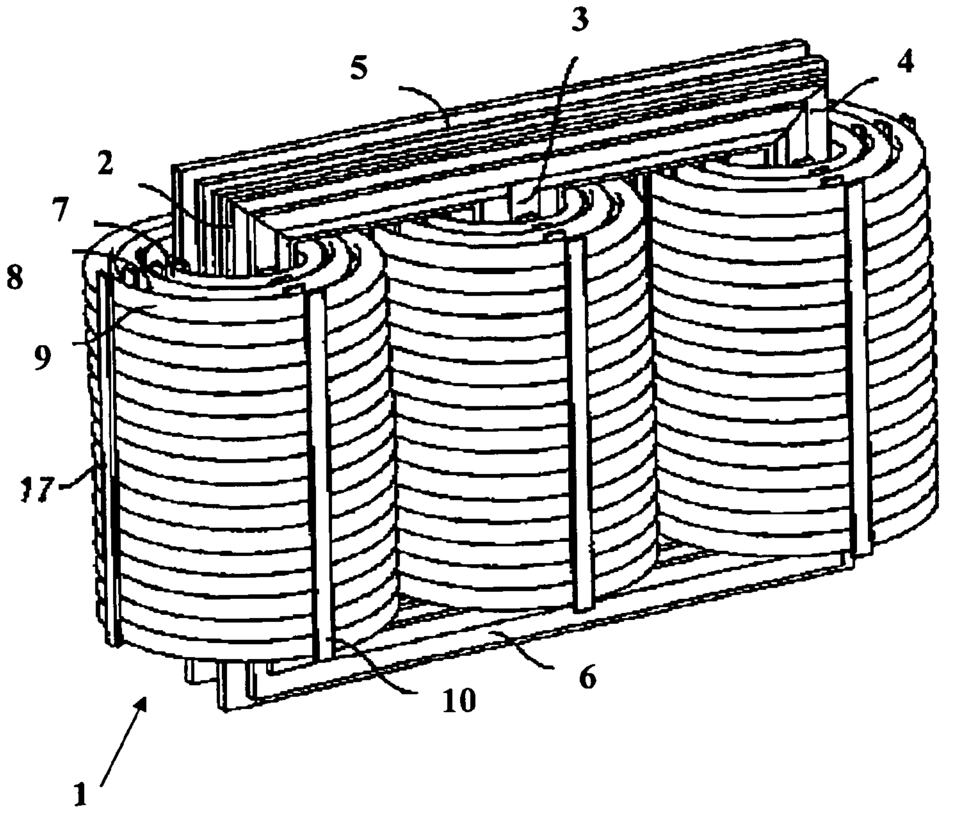
FIG. 2 illustrates an example of component of a three-phase power transformer.

FIG. 2 illustrates just one example of an electrical transformer, namely a three-phase power transformer indicated by the overall reference number 1. The transformer 1 comprises a conventional laminated core which is formed from a suitable magnetic material, such as textured silicon steel or an amorphous alloy. The core comprises a first winding leg 2, a second winding leg 3, and a third winding leg 4. The core also comprises an upper yoke 5 and a lower yoke 6. Opposing ends of each of the first, second, and third winding legs 2, 3, 4 are fixedly coupled to the upper and lower yokes 5 and 6 using, for example, a suitable adhesive. Primary and secondary windings are positioned around the respective legs according to various configurations. For instance, in the example of FIG. 1, primary windings 7, are positioned around the respective first, second, and third winding legs 2, 3, 4. For each leg 2, 3, or 4, secondary windings 8 and 9 are likewise positioned around the respective primary winding 7. Spacing bars 10 with several different functions may be located at certain points around the windings 7, 8, 9. For instance, spacing bars 10 may be formed of insulating material intended to provide a certain space between the winding turns for cooling, supporting, etc. They may also be formed of electrically conducting material in order to form part of the earthing system of the windings. Additional structural elements and functional details of the transformer 1, such as the electrical connections between its windings and other components, e.g. a power source, loads etc., are not shown in FIG. 1 nor will be described hereinafter since they are not necessary for the scope and understanding of the present invention.

Each transformer winding, as the windings 7, 8, 9 illustrated in FIG. 2, is composed of a plurality of n segments indicated hereinafter as ($S_1, S_2, \ldots, S_n$) which are electrical circuits connected in series. Each segment is formed by a certain number of turns, hereinafter referred to as ($t_1, t_2, \ldots, t_n$) respectively, which are made of an electrical conductor, typically a wire or a cable. The number of segments ($S_1, S_2, \ldots, S_n$) connected in series, and in particular the number of turns ($t_1, t_2, \ldots, t_n$) of each of these segments connected in series, determines the actual voltage(s) that a transformer will be able to produce.

Figure 3:
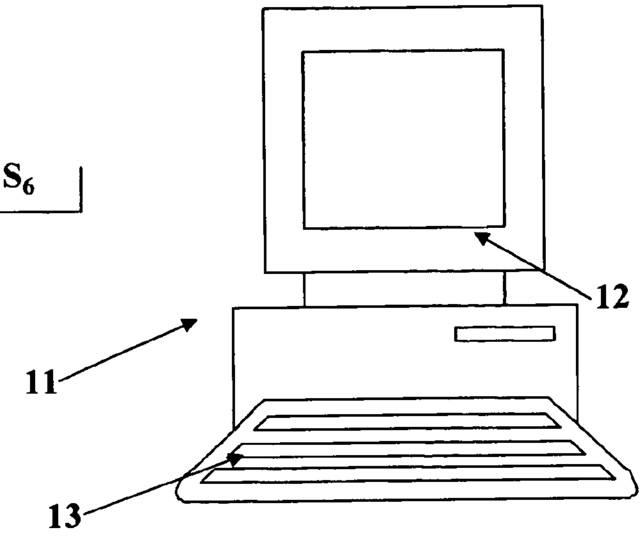
FIG. 3 illustrates an exemplary system for calculating the number of turns per segment of a transformer coil winding according to the present invention.

To calculate the number of turns of the various segments, a transformer designer initiates the method according to the invention. As it will be appreciated by any person skilled in the art from the following description, the software algorithm at the base of the method according to the invention, can be implemented in any suitable computing device or system and can be utilized as a stand alone component, or in connection or even integrated with any other software tool, such as a tool for designing electrical devices and in particular transformers. For example, the designer can log into the computing device 11 illustrated in FIG. 3, and when the instructions appears on the video interface 12, data required can be input by means of the keypad 13 (or mouse or equivalent devices). The algorithm can be already resident on the computing device 11, or can be loaded by the designer through a computer program product, such as a diskette embodying the various instructions.

As illustrated in FIG. 1, in a phase 100, the designer assigns to each of the n segments ($S_1, S_2, \ldots, S_n$) of a winding a predetermined value ($R_i$) representing the respective volts-per-turn value.

According to a first embodiment of the present invention, two respective predetermined volts-per-turn values ($R_{ia}$) and ($R_{ib}$) which are different from each other are assigned to an associated one of at least two of the plurality of n segments ($S_1, S_2, \ldots S_n$). The remaining segments ($S_1, S_2, \ldots S_n$) are assigned each with a respective value ($R_i$) which may different or equal either to ($R_{ia}$) or ($R_{ib}$).

Alternatively, all n segments ($S_1, S_2, \ldots S_n$) are assigned with the same volts-per-turn value ($R_i$).

The method according to the present invention further comprises a phase 101 wherein a respective predetermined voltage value ($V_1, V_2, \ldots, V_n$) is assigned to each combination of segments, $S_1$-$S_n$, $S_1$-$S_{n-1}$-$S_n$, $S_1$-$S_2$-$S_{n-1}$-$S_n$ et cetera, obtained by the connection in series of one or more of the n segments with one reference segment ($S_n$) which is selected among the n segments themselves. In practice in this phase 101, a designer inputs a value $V_1$ representing the desired voltage across the circuit obtained by connecting in series segment $S_1$ with the reference segment $S_n$. $V_2$ is the value assigned by the designer and representing the desired voltage across the circuit obtained by connecting in series segments $S_1$, $S_{n-1}$, and $S_n$. $V_3$ is the assigned value representing the voltage across the combination obtained by considering connected in series segments $S_1$, $S_2$, $S_{n-1}$, and $S_n$, and so on.

In a phase 102 the designer assigns a predetermined number of turns ($t_n$) to at least the segment ($S_n$) selected as reference. This predetermined number of turns ($t_n$) assigned to the reference segment ($S_n$) is given as a percentage of a prefixed number of turns, namely as a percentage of the total number of turns present in one of the circuits formed by one of the combination of segments $S_1$-$S_n$, $S_1$-$S_{n-1}$-$S_n$, $S_1$-$S_2$-$S_{n-1}$-$S_n$ above indicated. Preferably, this predetermined number of turns ($t_n$) assigned to the reference segment ($S_n$) is given as a percentage of the number of turns present in the circuit formed by the connection in series of two segments, i.e. segment $S_1$, and reference segment $S_n$.

Alternatively, the number of turns ($t_n$) assigned to the reference segment ($S_n$) can be directly a prefixed numeric value.

The predetermined voltage-per-turns value ($R_i$), the predetermined number of turns ($t_n$) assigned to the reference segment ($S_n$), and the various voltage values ($V_1, V_2, \ldots, V_n$) assigned to the above mentioned combinations of segments $S_1$-$S_n$, $S_1$-$S_{n-1}$-$S_n$, $S_1$-$S_2$-$S_{n-1}$-$S_n$ et cetera, are selected by the designer based either on customer requirements and/or on designers practical experience, and are readily known to those skilled in the art.

As it can be appreciated by any person skilled in the art, in the method according to the invention, the foregoing phases 100, 101 and 102, could be carried out in whatever order. For example, the instructions can be organized in order to require the designer first to input the voltage values $V_i$ across the various combinations of segments, and then to assign the voltage-per-turns value ($R_i$) to each segment, etc.

After phases, 100, 101, and 102, the method comprises a phase 103 where a system of (n−1) linear equations in (n−1) unknowns is generated for example by a processing unit of the computing device 11. In particular, the (n−1) equations are generated simultaneously. Such (n−1) unknowns represent the number of turns for all n segments other than the reference segment ($S_n$).

Preferably, the system of (n−1) linear equations in n unknowns comprises the following equations:

$$t_1R_1=V_1-t_nR_n$$

$$t_1R_1+t_{n-1}R_{n-1}=V_2-t_nR_n$$

$$t_1R_1+t_2R_2+t_{n-1}R_{n-1}=V_3-t_nR_n$$

$$\ldots$$

$$t_1R_1+t_2R_2+t_3R_3+\ldots+t_{n-1}R_{n-1}=V_n-t_nR_n$$

Finally, in a phase 104 the system of (n−1) linear equations are simultaneously solved to thereby determine the number of turns for each of the n segments other than the reference segment ($S_n$). For example, the number of turns is computed by the algorithm for the various segments by means of the processing unit of the computing device 11.

Preferably, in the method according to the present invention, the system of (n−1) simultaneous linear equations is solved by means of an augmented matrix and Gaussian elimination.

Accordingly, solving the above set of equations using an augmented matrix and Gaussian elimination leads to the following matrix reduction (shown here using only 3 voltages for the sake of simplicity):

$$\left(\begin{array}{ccc|c} R & 0 & 0 & V_1-t_nR \\ R & R & 0 & V_2-t_nR \\ R & R & R & V_3-t_nR \end{array}\right) \Rightarrow \left(\begin{array}{ccc|c} R & 0 & 0 & V_1-t_nR \\ 0 & R & 0 & V_2-V_1 \\ 0 & 0 & R & V_3-V_2 \end{array}\right) \Rightarrow \left(\begin{array}{ccc|c} 1 & 0 & 0 & \frac{V_1-t_nR}{R} \\ 0 & 1 & 0 & \frac{V_2-V_1}{R} \\ 0 & 0 & 1 & \frac{V_3-V_2}{R} \end{array}\right)$$

or in this form if the volts-per-turn value ($R_i$) is different for the various segments:

$$\left(\begin{array}{ccc|c} R_1 & 0 & 0 & V_1-t_nR_n \\ R_1 & R_2 & 0 & V_2-t_nR_n \\ R_1 & R_2 & R_3 & V_3-t_nR_n \end{array}\right)$$

The above matrix would be processed as per passages indicated by the arrows above.

Figure 4:
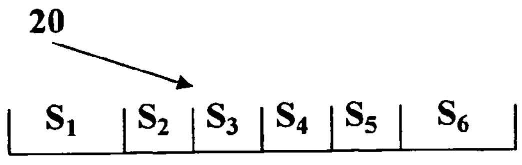
FIG. 4 is a schematic representation of a transformer winding having six windings connected in series.

Two numerical examples for calculating the number of turns of a transformer coil winding as schematically represented in FIG. 4 using the method of the present invention will be given hereinafter.

As illustrated in FIG. 4, the exemplary winding 20 comprises six segments $S_1$, $S_2$, $S_3$, $S_4$, $S_5$, $S_6$. If among the various segments of the winding 20 there would be one break segment, as it happens in some practical applications but not in the examples below, this break segment as such does not participate in any electrical circuit and therefore would not be considered in or have any impact on the calculation since only the other remaining segments would be useful for producing the desired voltages.

The above indicated six segments form the following five electrical circuits:

circuit 1: formed by connecting in series segments $S_1$ and $S_6$;

circuit 2: formed by connecting in series segment $S_1$, $S_5$, and $S_6$;

circuit 3: formed by connecting in series segment $S_1$, $S_2$, $S_5$, and $S_6$;

circuit 4: formed by connecting in series segment $S_1$, $S_2$, $S_4$, $S_5$, and $S_6$;

circuit 5: formed by connecting in series segment $S_1$, $S_2$, $S_3$, $S_4$, $S_5$, and $S_6$.

In this example all six segments are assigned with the same volts-per-turn value ($R_i$), e.g. $R_i=7$. Further, segment $S_6$ would be the reference segment and the designer assigns to it a number of turns equal to 50% of the turns of circuit 1, i.e. the circuit formed by the connection of segment $S_1$ and segment $S_6$.

Based on customer requirements, the desired voltages assigned by the designer across each of the above five combinations of segments are, respectively: $V_1=9000$, $V_2=9500$, $V_3=10000$, $V_4=10500$, and $V_5=11000$.

In this way it is possible to calculate the number of turns of $S_6$. Since the voltage across circuit 1 is $V_1=9000$ and 50% of the turns are in $S_6$, then $S_6$ contributes to 50% of the voltage $V_1$ which equals 4500 volts. Dividing this value by R=7, it is obtained the value 642.85 which would represent the exact numeric value of turns $t_6$ for $S_6$. Clearly, since turns can have only whole numbers, the calculated value is rounded to 643 turns. This value $t_6=643$ can be used to generate a system of five equations that will be solved simultaneously:

$$t_1\times7=9000-643\times7=4499 \qquad \text{equation 1:}$$

$$t_1\times7+t_5\times7=9500-643\times7=4999 \qquad \text{equation 2:}$$

$$t_1\times7+t_2\times7+t_5\times7=10000-643\times7=5499 \qquad \text{equation 3:}$$

$$t_1\times7+t_2\times7+t_4\times7+t_5\times7=10500-643\times7=5999 \qquad \text{equation 4:}$$

$$t_1\times7+t_2\times7+t_3\times7+t_4\times7+t_5\times7=11000-643\times7-6499 \qquad \text{equation 5:}$$

By simultaneously solving the above set of equations using an augmented matrix and Gaussian elimination leads to the following results: (equation 1) $t_1=642.7$ (when rounded equals to 643 turns); (equation 2) $t_5=71.1$ turns, which would be rounded to 71 turns; (equation 3) $t_2=71.6$ turns, which would be rounded to 72 turns; (equation 4) $t_4=71$ (rounded) turns; (equation 5) $t_3=71.4$ (rounded to 71) turns;

In total the winding 20 has therefore 643+643+71+72+71+71=1571 turns.

It is possible to check the calculations carried out by multiplying the total number of turns in a circuit to see what voltage(s) will be actually obtained:

circuit 1: 643+643=1286 turns. Multiplying this number by 7 (volts-per-turn value) results in 9002 volts;

circuit 2: 643+643+71=1357 turns. Multiplying this value by 7 (volts-per-turn value) results in 9499 volts;

circuit 3: 643+643+71+72=1429 turns. Multiplying by 7 (volts-per-turn value) results in 10003 volts;

circuit 4: 643+643+71+72+71=1500 turns. Multiplying by 7 (volts-per-turn value) results in 10500 volts;

circuit 5: 643+643+71+72+71+71=1571 turns. Multiplying by 7 (volts-per-turn value) results in 10997 volts.

It is therefore evident from the above that the method according to the invention allows to calculate actual voltages which are very close to the ideal desired values.

A second example for calculating the number of turns for the segments of transformer winding 20 will now be given wherein the volts-per-turn value is not the same for all segments. For example, the designer assigns to segments $S_1$ and $S_6$ a volts-per-turn value R=7. For segments $S_2$ and $S_5$, R will be equal to 6.5. For segments $S_3$ and $S_4$, R is assigned equal to 6.

Also in this example, the desired voltages assigned by the designer across each of the above five circuits are, respectively: $V_1$=9000, $V_2$=9500, $V_3$=10000, $V_4$=10500, and $V_5$=11000. Likewise, segment $S_6$ is the reference segment and the designer assigns to it a number of turns equal to 50% of the turns of circuit 1, i.e. the circuit formed by the connection of segment $S_1$ and segment $S_6$.

By proceeding as in the previous example, it is possible to calculate the number of turns $t_6$=643(rounded) and have the following system of five equations:

$$t_1\times7=9000-643*7=4499 \qquad \text{equation 1:}$$

$$t_1\times7+t_5\times6.5=9500-643*7=4999 \qquad \text{equation 2:}$$

$$t_1\times7+t_2\times6.5+t_5\times6.5=10000-643*7=5999 \qquad \text{equation 3:}$$

$$t_1\times7+t_2\times6.5+t_4\times6+t_5\times6.5=10500-643*7=5999 \qquad \text{equation 4:}$$

$$t_1\times7+t_2\times6.5+t_3\times6+t_4\times6+t_5\times6.5=11000-643*7=6499 \qquad \text{equation 5:}$$

By simultaneously solving the above set of equations using an augmented matrix and Gaussian elimination leads to the following results: (equation 1) $t_1$=642.7 (when rounded equals to 643 turns); (equation 2) $t_5$=76.6 turns, which would be rounded to 77 turns; (equation 3) $t_2$=76.5 turns, which would be rounded to 77 turns; (equation 4) $t_4$=82.8 rounded to 83 turns; (equation 5) $t_3$=83.1 rounded to 83 turns.

In total the winding 20 has in this case 643+643+77+77+83+83=1606 turns.

The calculated results can be verified as follow:

643*7+643*7=9002 volts. circuit 1:

643*7+643*7+77*6.5=9502.5 volts. circuit 2:

643*7+643*7+77*6.5+77*6.5=10003 volts. circuit 3:

643*7+643*7+77*6.5+77*6.5+83*6=10501 volts. circuit 4:

643*7+643*7+77*6.5+77*6.5+83*6+83*6=10999 volts. circuit 5:

Also in this case, this verification certifies the validity of the actual calculated values with respect to the desired ones.

As evident from the foregoing description, the method according to the invention allows a more general and flexible approach in the calculation of the number of turns per segment of a transformer winding, and allows having reliable results also when the parameters of the segments, such as the volts-per-turn values, vary among the various segments. In particular, by using simultaneous equations the method generalizes the calculation of turns and hence when a new design is developed it is not necessary to hardcode new equations into the software. In turn, it is not necessary to recompile and re-link the software and it also does not require redistributing the software to the users.

As will be appreciated by one of skill in the art and as before mentioned, the present invention may be embodied as or take the form of the method previously described, a computing device or system having program code configured to carry out the operations, a computer program product on a computer-usable or computer-readable medium having computer-usable program code embodied in the medium. The computer-usable or computer-readable medium may be any medium that can contain, store, communicate, propagate, or transport the program for use by or in connection with the instruction execution system, apparatus, or device and may by way of example but without limitation, be an electronic, magnetic, optical, electromagnetic, infrared, or semiconductor system, apparatus, device, or propagation medium or even be paper or other suitable medium upon which the program is printed. More specific examples (a non-exhaustive list) of the computer-readable medium would include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the present invention may be written in any suitable programming language provided it allows to achieve the previously described technical results. The program code may execute entirely on the user's computing device, partly on the user's computing device, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method performed by a computer for calculating the number of turns ($t_1$, $t_2$, . . . , $t_n$) per segment of a transformer coil winding which comprises n segments ($S_1$, $S_2$, . . . , $S_n$,) connected in series, the method comprising:

- assigning to each of said n segments ($S_1$, $S_2$, . . . , $S_n$) a predetermined value ($R_i$) representing the respective volts-per-turn value;
- assigning to each combination of segments ($S_1$-$S_n$, $S_1$-$S_{n-1}$-$S_n$, $S_1$-$S_2$-$S_{n-1}$-$S_n$, . . . ) obtained by the connection in series of one or more of said n segments with one reference segment ($S_n$) selected from said n segments a respective predetermined value ($V_1$, $V_2$, . . . , $V_n$) representing the voltage across each of said combinations;
- assigning a predetermined number of turns ($t_n$) to at least said reference segment ($S_n$);
- generating simultaneously a system of (n−1) linear equations in (n−1) unknowns wherein said (n−1) unknowns represent the number of turns for all segments other than said reference segment ($S_n$);

solving said system of (n−1) linear equations simultaneously to thereby determine the number of turns of all segments other than said reference segment ($S_n$).

2. A method as in claim 1 wherein said system of (n−1) linear equations is solved by means of an augmented matrix and Gaussian elimination.

3. A method as in claim 1 wherein at least two of said n segments ($S_1, S_2, \ldots S_n$) are assigned two respective predetermined volts-per-turn values ($R_i$) which are different from each other.

4. A method as in claim 1 wherein all said n segments ($S_1, S_2, \ldots S_n$) are assigned with a same volts-per-turn value ($R_i$).

5. A method as in claim 1 wherein said predetermined number of turns ($t_n$) assigned to said reference segment ($S_n$) is given as a percentage of the number of turns present in one of said combination of segments.

6. A method as in claim 1 wherein said system of (n−1) linear equations in n unknowns comprises the following equations:

$$t_1R_1=V_1-t_nR_n$$

$$t_1R_1+t_2R_2=V_2-t_nR_n$$

$$\ldots$$

$$t_1R_1+t_2R_2+\ldots+t_{n-1}R_{n-1}=V_n-t_nR_n.$$

7. A computer program product for calculating the number of turns ($t_1, t_2, \ldots, t_n$) per segment of a transformer coil winding which comprises n segments ($S_1, S_2, \ldots, S_n$,) connected in series, comprising a non-transitory computer-readable medium having thereon computer usable program code programmed to:

assign to each of said n segments ($S_1, S_2, \ldots, S_n$) a predetermined value ($R_i$) representing the respective volts-per-turn value;

assign to each combination of segments ($S_1$-$S_n$, $S_1$-$S_{n-1}$-$S_n$, $S_1$-$S_2$-$S_{n-1}$-$S_n$, . . . ) obtained by the connection in series of one or more of said n segments with one reference segment ($S_n$) selected from said n segments themselves a respective predetermined value ($V_1, V_2, \ldots, V_n$) representing the voltage across each of said combinations;

assign a predetermined number of turns ($t_n$) to at least said reference segment ($S_n$);

generate simultaneously a system of (n−1) linear equations in (n−1) unknowns wherein said unknowns represent the number of turns for all segments other than said reference segment ($S_n$);

solve said system of (n−1) linear equations simultaneously to thereby determine the number of turns of all segments other than said reference segment ($S_n$).

8. A computer program product as in claim 7, wherein said computer usable program code is configured to solve said system of (n−1) linear equations by means of an augmented matrix and Gaussian elimination.

9. A computer program product as in claim 7, wherein said computer usable program code is configured to assign at least two of said n segments ($S_1, S_2, \ldots S_n$) two respective predetermined volts-per-turn values ($R_i$) which are different from each other.

10. A computer program product as in claim 7, wherein said computer usable program code is configured to assign the same volts-per-turn value ($R_i$) to all said n segments ($S_1, S_2, \ldots S_n$).

11. A computer program product as in claim 7, wherein said computer usable program code is configured to assign said predetermined number of turns ($t_n$) to said reference segment ($S_n$) as a percentage of the number of turns present in one of said combination of segments.

12. A system for calculating the number of turns ($t_1, t_2, \ldots, t_n$) per segment of a transformer coil winding which comprises n segments ($S_1, S_2, \ldots, S_n$,) connected in series, the system comprising a computing device having therein program code programmed to:

assign to each of said n segments ($S_1, S_2, \ldots, S_n$) a predetermined value ($R_i$) representing the respective volts-per-turn value;

assign to each combination of segments ($S_1$-$S_n$, $S_1$-$S_{n-1}$-$S_n$, $S_1$-$S_2$-$S_{n-1}$-$S_n$, . . . ) obtained by the connection in series of one or more of said n segments with one reference segment ($S_n$) selected from said n segments themselves a respective predetermined value ($V_1, V_2, \ldots, V_n$) representing the voltage across each of said combinations;

assign a predetermined number of turns ($t_n$) to at least said reference segment ($S_n$);

generate simultaneously a system of (n−1) linear equations in (n−1) unknowns wherein said unknowns represent the number of turns for all segments other than said reference segment ($S_n$);

solve said system of (n−1) linear equations simultaneously to thereby determine the number of turns of all segments other than said reference segment ($S_n$).

13. A system as in claim 12 wherein said computer usable program code is configured to solve said system of (n−1) linear equations by means of an augmented matrix and Gaussian elimination.

14. A system as in claim 12 wherein said computer usable program code is configured to assign at least two of said n segments ($S_1, S_2, \ldots S_n$) two respective predetermined volts-per-turn values ($R_i$) which are different from each other.

15. A system as in claim 12, wherein said computer usable program code is configured to assign the same volts-per-turn values ($R_i$) to all said n segments ($S_1, S_2, \ldots S_n$).

16. A system as in claim 12, wherein said computer usable program code is configured to assign said predetermined number of turns ($t_n$) to said reference segment ($S_n$) as a percentage of the number of turns present in one of said combination of segments.

* * * * *